United States Patent [19]

Baldi

[11] 4,443,557
[45] Apr. 17, 1984

[54] TREATMENT OF CATALYTIC RANEY NICKEL

[75] Inventor: Alfonso L. Baldi, Wynnewood, Pa.

[73] Assignee: Alloy Surfaces Company, Inc., Wilmington, Del.

[21] Appl. No.: 359,212

[22] Filed: Mar. 18, 1982

Related U.S. Application Data

[63] Continuation-in-part of Ser. No. 25,456, Mar. 30, 1979, Pat. No. 4,349,612, and a continuation-in-part of Ser. No. 172,671, Jul. 28, 1980, and a continuation-in-part of Ser. No. 281,405, Jul. 8, 1981, and a continuation-in-part of Ser. No. 302,979, Sep. 17, 1981, said Ser. No. 25,456, is a continuation-in-part of Ser. No. 963,313, Nov. 27, 1978, abandoned.

[51] Int. Cl.³ .............................................. B01J 25/02
[52] U.S. Cl. .................................................... 502/301
[58] Field of Search ................ 252/477 Q, 466 J, 472

[56] References Cited

U.S. PATENT DOCUMENTS 3,637,437  1/1972  Goldberger ........................... 429/44
4,049,580  9/1977  Oden et al. ........................ 252/466 J
4,175,954 11/1979  Oden et al. ............................ 75/138

Primary Examiner—W. J. Shine
Attorney, Agent, or Firm—Connolly and Hutz

[57] ABSTRACT

Pyrophorically activated metals are suitable catalysts for electrolyzing water and for other reactions in which nickel or platinum are catalysts. Pyrophoricity can be eliminated without destroying the catalytic effects. Protective coverings can protect and preserve the pyrophoricity. Raney type activation leaves a little aluminum in the activated metal and this aids in catalytic action.

9 Claims, No Drawings

TREATMENT OF CATALYTIC RANEY NICKEL

The present application is a continuation-in-part of prior applications Ser. Nos. 25,456 filed Mar. 30, 1979 (Pat. No. 4,349,612 granted Sept. 14, 1982), 172,671 filed July 28, 1980; 281,405 filed July 8, 1981 and 302,979 filed Sept. 17, 1981. Ser. No. 25,456 is in turn a continuation-in-part of application Ser. No. 963,313 filed Nov. 27, 1978 and subsequently abandoned.

The present invention relates to the diffusion coating of metals.

Among the objects of the present invention is the provision of novel coating techniques and compositions for use therewith, as well as novel coated products, all suitable for commercial operations.

When a nickel surface of high catalytic activity is desired, the nickel is best subjected to diffusion aluminizing in a plurality of stages before the leaching. In the first diffusion stage the activity of the inwardly diffusing aluminum is kept low, as by using an aluminum diffusion pack containing 10 to 40% aluminum, the balance alumina, with a 0.3% $AlCl_3$ energizer added. A diffusion treatment of 1050° to 1100° F. for 20 to 30 hours with such a pack causes the formation on the nickel surface of an aluminized case in which essentially all its aluminum is in the form of $Ni_2Al_3$ intermetallic.

In a subsequent diffusion aluminizing stage the outer portion of the aluminized case is modified to convert the $Ni_2Al_3$ to a higher aluminide of nickel. The aluminizing pack of the first stage can be used in a second stage conducted at a lower temperature, as for example from about 880° to about 920° F., for 20 to 30 hours as an effective technique for converting the aluminide in the outermost portion of the case to higher aluminide.

These two different steps are the only ones needed, and nickel so treated and then leached with 5 to 50% aqueous caustic soda has an exceptionally good catalytic action in hydrogenation reactions such as the hydrogenation of benzene or phenol or coal as in coal gasification. This double diffusion is illustrated in the following example.

EXAMPLE

A six-foot square section of nickel screening is solvent degreased, placed in a previously aluminized steel retort containing a mix of 20% Al (40 microns) and 80% $Al_2O_3$ (325 mesh) with ½% $AlCl_3$ distributed throughout the mix. Diffusion coating is effected in $H_2$ at 1050°–1100° F. for 25 hours to provide a 0.006 inch case of primarily $Ni_2Al_3$. The diffusion coating step is then repeated using the same pack mixture as above but this time at a temperature of 850° to 900° F. for 30 hours to provide a predominately $NiAl_3$ 1 mil thick coating on top of the aforementioned $Ni_2Al_3$ coating. The resulting screen is washed, dried, and stored or leached. Treatment with 20% NaOH at room temperature primarily leaches out the Al from the $NiAl_3$ layer with minor effect on the $Ni_2Al_3$ layer. When the leaching action has subsided, the screen is washed and immediately placed in a liquid such as cyclohexane to prevent surface oxidation until ready for use. Poorly volatile liquids such as glycerol, ethylene glycol, kerosene or triethanolamine, or congealable liquids such as melted wax can be used to protect the active surface while the screen is installed in the hydrogenating equipment and can then be washed off. The double diffusion can also be effected on sheet, foil or tubes, as well as on nickel that is plated on a support such as steel, with equally good results. In general at least about 1 mil of $Ni_2Al_3$ case should be present in the leached product below the activated surface layer left by the leaching. Also that activated surface layer should be at least about 0.5 mil deep.

The second aluminizing stage can, if desired, be effected by merely extending the time during which the nickel being treated cools down after the completion of the first stage. Thus the furnace heat can be turned on again during the initial cool-down when the retort temperature reaches about 925° F., and can then hold the desired second stage temperature.

The improved activity resulting from the foregoing dual diffusion is not noticeable when preparing activated platinum by diffusing aluminum into it and then leaching. However activated platinum prepared in this way is more stable and can be exposed to air without loss of activity. Indeed when such activated platinum is used as an igniter for hydrogen, a job it does well at and even below room temperature, it is preferably kept exposed to air when not doing any igniting. It can also be advantageously arranged to be held in a stream of a mixture of air and hydrogen as that stream flows to a hydrogen-burning jet, and in a location relatively close to but upstream from that jet, so that the active platinum assures the ignition of the stream yet remains out of the flame burning at the jet. In such arrangement the dual diffusion of the aluminum is not needed.

Catalytically activating the surface of a metal foam, such as nickel foam described in U.S. Pat. No. 3,111,396 is particularly desirable inasmuch as such a foam presents a very large metal surface and does not have the fragility of thin foil or screening. The diffusion-coating treatment generally introduces into the surface of the metal being activated a relatively high concentration of an embrittling metal such as aluminum, and fragile shapes such as foil and thin screening tend to break unless very carefully handled during this treatment.

The catalytic activation of platinum and other metals of the platinum family is preferably applied to very thin substrates in the interest of reducing the amount of such expensive metals needed, and here also a metal foam shape as described in U.S. Pat. No. 3,111,396 is desirable.

To minimize having thin nickel foil rendered too fragile the diffusion step can be carried out at minimum temperatures to reduce the depth of the diffusion case. Thus a 0.1 to 0.5 mil case can be provided on a nickel foil 1 to 2 mils thick by aluminizing at a temperature between 650° and 800° F. The foil is increased in thickness by the aluminizing, so that a heavy aluminizing of a one-mil thick foil can yield a product 3 or more mils thick with each face having an aluminized case and both cases together occupying about 2.6 mils of that thickness.

The fragility of thin foils when diffusion coated, can also be offset by having the metal of the foil in the form of a surface layer securely held on a carrier foil or sheet made of metal that does not have the objectionable fragility and can be subsequently separated from that surface layer. Thus a 5 mil thick aluminum sheet can have electroplated on one face a one mil thick layer of nickel or cobalt, using a preliminary flash coating of chromium or zinc to get the nickel or cobalt to adherently deposit. The final coated aluminum sheet is then subject to a 20-hour diffusion treatment at 750° to 850° F. in a hydrogen-bathed atmosphere to cause the aluminum to diffuse most of the way through the nickel or cobalt layer, after which the resulting product is subjected to caustic leaching to dissolve the aluminum. This leaves a catalytically active nickel or cobalt foil that contains a residual small content of diffused-in aluminum and holds itself together adequately for normal handling. Although pyrophoric, its catalytic activity is not as high as is available from a pack diffusion process without the aluminum carrier sheet, but it does a good job of catalyzing hydrogenation and other chemical reactions including ammonia oxidation and HCN formation. Of particular interest, a Ni or Co plating formed by electroplating in the above manner has a particularly low density thus limiting the amount of mass needed per unit volume of catalyst.

Both faces of the aluminum sheet can be given nickel or cobalt platings in which case the corners or edges of the plated sheet can be trimmed off to expose the aluminum substrate for leaching.

A very effective zinc flash for the foregoing plating sequence is obtained by a ½ to 1 minute dip of the cleaned aluminum sheet at room temperature in the following solution:

| | |
|---|---|
| NaOH | 525 grams |
| ZnO | 100 grams |
| FeCl$_3$.6H$_2$O | 1 gram |
| NaKC$_4$H$_4$O$_6$.4H$_2$O | 10 grams |
| Water | to make one liter |

Platinum and other catalytic metals can similarly be converted to catalytic foil, and other leachable metals like zinc can be used as the supporting foil in place of aluminum. The supporting layer can also be made by spraying molten aluminum or zinc on a surface of the foil that is to be activated.

Palladium is best catalytically activated with zinc. A simple diffusion of about 1 to 30 milligrams of zinc per square centimeter of palladium surface, followed by leaching with strong, at least 10%, HCl in water at 95° C., produces from a 1 mil thick foil a very effective catalyst. A typical pack diffusion treatment for palladium is the embedding of a 52-mesh palladium screen the wires of which are 4 mils thick, in a pack of 20% powdered zinc and 80% alumina, energized with ½% NH$_4$Cl, and heating for 4 hours at 600° F. in a hydrogen-bathed atmosphere. This effects a zinc pick-up of 4 mg/cm$^2$, essentially all of which is leached out by 20% HCl in 10 minutes. The resulting screen is pyrophoric when exposed to air.

Zinc can be similarly diffused into titanium foil in a hydrogen-bathed atmosphere from such a zinc-containing pack. As an example a 4 mil thick titanium foil is embedded in a pack having the following composition:

| | |
|---|---|
| 80 g | Zn |
| 16 g | Al |
| 305 g | Al$_2$O$_3$ |
| 4 g | AlCl$_3$ | and subjected to 10 hours of diffusion at 950° to 1000° F. The foil picks up about 3.5 milligrams of zinc per square centimeter. It is worthy of note that the titanium does not become seriously embrittled by such treatment, and can be bent around a ⅛-inch radius without cracking. The diffused-in zinc can be leached out with 20% boiling NaOH solution to leave a very active catalytic surface. Titanium activated this way still retains a little of the zinc and can be used as a conventional electrolysis electrode, or as a substitute for the photosensitive electrodes described in the Augustynski et al paper in the Journal of the Electrochemical Society, Volume 124, No. 7, pages 1063-64 (1977).

Titanium activated by aluminizing and leaching can also be so used. Such titanium, still containing a little of the aluminum, can be heated in air or under other oxidizing conditions to convert some of its porous activation case to mixed titanium aluminum oxides and such a treated titanium makes a very effective photo-anode for photolysis of water containing a little NaOH. Even without the heat-treatment it is a very good photo-anode. Tin can also be diffused into titanium to provide similar results with and without the subsequent oxidation.

Whether the zincized, aluminized or stannized titanium is used as a photo-electrode, a platinum or platinized platinum or activated platinum counter-electrode is helpful. Activated platinum made as described in U.S. Pat. No. 4,154,705 is particularly helpful. A little ruthenium, such as 1 to 5% by weight can be incorporated in the titanium before it is aluminized, zincized or stannized, as a further improvement.

Instead of using separate electrodes for the photolysis, they can be provided in powdered form and mixed with each other as well as with other substances such as cadmium sulfide that also help with the photolysis.

Hydrogen peroxide appears to form during the foregoing photolysis and some exothermic heat is also generated and can be used to help keep the photolysis combination warm.

For some purposes, such as catalytic alkylation, it is helpful to have a catalytic tin surface. Inasmuch as tin is a very low melting metal, it is helpful to first diffuse the tin into a high-melting support such as nickel. By way of example an 80-mesh nickel gauze made of 4 mil thick wire, is embedded in the following pack:

| | |
|---|---|
| Tin powder | 73 grams |
| Nickel powder | 27 grams |
| Alumina | 300 grams |
| NH$_4$Cl | 4 grams | which pack had been pre-fired at 1000° F. for 5 hours and then had its NH$_4$Cl content replenished. Diffusion is conducted in hydrogen at 1400° F. for 5 hours to give a 20 milligram per square centimeter pick-up. The resulting tin-containing gauze after removal from the pack, is subjected to post diffusion by heating in hydrogen at 1600° to 1700° F. for 5 hours to leave the diffusion case about 1.3 mils thick. This product is now activated by a pack diffusion at 850° to 900° F. for 30 hours using a pack having 20% powdered aluminum, 80% powdered alumina, and energized with ½% anhydrous aluminum chloride. The aluminized product is then subjected to leaching with 10% NaOH solution to extract most of the diffused-in aluminum and leave an activated tin-nickel surface.

An activated copper-palladium surface can be prepared as by first electroplating a 1 mil thick layer of copper on a 1 mil thick palladium foil, heating the copper-palladium combination in hydrogen at 1050°-1100° F. for 12 hours to diffuse the copper deeply into the palladium, and then diffusion coating the resulting product under hydrogen in a pack containing 10% zinc, 90% alumina, and activated with ½% NH$_4$Cl. Ten hours of such treatment at 660°-690° F. produces a pick-up of about 7 milligrams of zinc per square centimeter of foil surface and a 0.7 mil thick case the surface stratum of which contains about 25% zinc. The final step in the activation is a leaching in 30% HCl for 3 minutes at about room temperature followed by 10 minutes more at about 212° F. in 15% HCl.

The pack diffusion to activate the catalyst can be effected in one step or in multiple diffusion steps under different diffusion conditions to vary the distribution of the diffused-in metal.

The catalytic activity withstands intense evacuation, although the activated surface gives off large quantities of hydrogen under the influence of the lowered pressure.

Activated nickel surfaces can be modified by dipping for a few seconds in aqueous hydrogen peroxide. A three volume percent $H_2O_2$ solution modifies the surface and turns it black so that it is no longer pyrophoric. The modified surface is however still catalytic and will for example show a strong decrease in overvoltage when used as a cathode or anode in electrolyzing aqueous NaOH to generate gas. The activation of platinum or its alloys can be similarly modified by immersion in aqueous $H_2O_2$ or in aqueous HCl at least 20% strong.

A pyrophoric activated surface will retain its pyrophoricity for some time if kept covered by an inert fluid—even argon gas—or by a dried film of caustic soda or sodium silicate. Such drying is best conducted in an inert atmosphere.

The preserving effect of a wet or dried film of caustic soda is greatly improved when a little tin is dissolved in it, as described in Ser. No. 172,671. As little as 4 grams of $SnCl_2 2H_2O$, or about 2 grams of tin, in 500 cc of aqueous caustic, and preferably twice that much, is desirable.

The pyrophoricity is enhanced by applying to the surface a pervious layer of material that accentuates heat generation. Thus a pyrophoric nickel screen can be momentarily dipped into a 1% solution of picric acid in water, and then dried in argon. Upon subsequent exposure to air it generates much more heat than a correspondingly activated nickel not dipped in the solution.

The foregoing intensifying effect is obtained with other heat-triggered materials such as trinitro toluene, ammonium nitrite, ammonium nitrate and triethanolamine. For intensification the triethanolamine layer should weigh less than one milligram per square centimeter, at least in spots. Intensification is also obtained with surfaces that before intensification show only a relatively low degree of pyrophoricity—such as a temperature rise of only about 50° F.

Inert fluids used to cover and preserve the pyrophoric surface are those that are inert to active hydrogen and nickel. Thus saturated hydrocarbon liquids like n-heptane or any of the nonane isomers make very effective preserving films, and if they are kept from evaporating off as by sealing such a filmed pyrophoric nickel in an argon armosphere, will preserve the pyrophoricity for months. Methyl ethyl ketone can also be used this way as a preserving film inasmuch as it is sufficiently inert, but glycerol is unusually effective.

Readily vaporizable preserving films, such as those having boiling points below about 125° C. also have the advantage of permitting pyrophoric action to develop by merely exposing the filmed surface to the open air so that the film evaporates within 1 or 2 minutes.

The presence of a liquid saturated hydrocarbon film preserves the pyrophoricity better than the mere sealing in an inert gas without such film. Preservation of pyrophoricity can also be accomplished by maintaining a blanket or atmosphere of hydrogen around the activated metal.

The pyrophoric action can also be used to ignite materials that then burn to deliver very large quantities of heat. Thus a magnesium ribbon about 4 mils thick can be rolled against a pyrophoric nickel foil that is protected by any of the above-noted coatings the rolling being effected under a pressure great enough to cause the ribbon to adhere to the foil. A force of 500 lbs. for example applied to such a ribbon by the semi-cylindrical nose of an anvil in which the cylindrical radius is ⅛ inch and the cylinder length ¾ inch, while the foil is backed up by a flat support, will cause the ribbon to adhere to the foil along a thin line corresponding to the peak of the semi-cylindrical nose, if the force is maintained for about 10 seconds.

The presence of a protective layer such as glycerine or triethanolamine on the foil does not prevent such adhesion. A magnesium ribbon about ¼ inch wide secured this way will be ignited when the protective layer is washed off and the washed foil dries out and becomes pyrophoric. The ignition of the ribbon generally starts at one point and the ribbon then burns along its length becoming incandescent, very much like an unsupported magnesium ribbon burns. A clean titanium foil can also be ignited this way.

A pyrophoric iron foil prepared like pyrophoric nickel foil shows somewhat lower peak surface temperatures—sometimes as high as 1300° F.—but takes a longer time to cool down. This apparent inconsistency may be due to a difference in the type of chemical change accompanying the pyrophoric action. It appears the nickel surface becomes converted to NiO, and the iron surface to $Fe_2O_3$ and/or $Fe_3O_4$ either of which conversions call for more heat liberation than the conversion of Ni to NiO. The iron conversion might also be effected in stages so that heat is generated in stages and the heat generated by the first stage is partly dissipated before the next heat generation stage. Also the quantity of hydrogen adsorbed on the iron seems smaller than that absorbed on the nickel.

It is preferred to leach the aluminized iron under relatively mild conditions, as by using 10% NaOH in water at 140°-160° F. for 15 to 20 minutes. More vigorous leaching leaves the iron with reduced pyrophoricity and also seems to cause some of the surface iron to slough off. The leaching of the aluminized iron yields a product of improved and more consistent properties if, as noted above, some dissolved tin is present in the leaching caustic. At least about 4 grams $SnCl_2.2H_2O$ to 50 grams of NaOH in 500 cc of water gives noticeable improvement, and at least twice that much time to preferred.

A very effective magnesium flare can be made by intimately adhering a pyrophoric strip of metal to a magnesium ribbon so as to cause the metal to become pyrophoric when exposed to air and to then ignite the magnesium. The pyrophoric strip can be larger or smaller than the magnesium ribbon. The length of the ribbon will generally determine the burning time, and the pyrophoric strip need be no larger than is sufficient to insure the ignition of the ribbon. Two or more pyrophoric strips can be adhered to different portions of a ribbon to help assure that it becomes ignited or to start it burning at different locations.

A half-minute flare can consist of a six inch length of magnesium ribbon about 3 mils thick and ¼ inch wide, with a one-inch by half-inch strip of pyrophoric nickel foil rolled onto one end. The combination has a low density and when dropped from an airplane will ignite and fall like a leaf at a relatively slow rate. Making the ribbon thinner and wider further reduces the rate of fall, so that a parachute is not needed to slow its descent. To prevent premature ignition the pyrophoric strip can have its surface protected against premature exposure to air, as by packing it under a protective atmosphere or a protective liquid, in an air-tight container. The protective atmosphere can be nitrogen, argon or hydrogen for example, and the protective liquid can be a readily evaporated one such as water, methanol or nonane.

A number of such magnesium flares can be packed into a single small container fitted like a shot-gun shell with a small propellant charge sufficient to expel the flares when fired from a shot-gun breech. Alternatively they can be packed in a container having a readily torn-off tear strip that opens the container when torn off and permits the flares to be ejected by whirling the open container to apply centrifugal force to the flares inside. If desired the container can be made of combustible material like paper that is itself ignited and consumed by a burning flare. The paper of such a container can be impregnated with wax or the like to make it gas-tight. A small amount of explosive can also be packed in the container to be detonated by the ignition of a flare and thus expel the flares and/or fragment the container.

For the production of large quantities of foil or ribbon, it is convenient to start with a coil of suitable material available in the market place. Thus a coil of 1 to 1.5 mil thick nickel or iron foil about six inches wide can be prepared for diffusion coating by unwinding it, passing the foil as it unwinds through a cleaning station where it can be electrolytically cleaned as a bipolar electrode in aqueous caustic, or abrasively cleaned on both sides by an air-propelled stream of fine glass grit, and coiling up the cleaned foil with one or more spacers that keep the adjacent coil turns spaced from each other. A thin layer of powdered diffusion coating pack makes an effective spacer. Only about ⅛ inch spacing is needed between turns, but the spacing can be as great as ¼ inch if desired.

The powdered spacing layer can be retained in place as by winding a continuous length of a twisted pair of wires into the recoiling so that the twisted wires extend along an edge of the foil and keep the powder from spilling out that edge, yet provides an adequate number of small gaps with respect to the foil surface it engages, to permit the diffusion coating atmosphere to penetrate. Two separate lengths of twisted wires can be used, one length at each edge of the foil.

The wires can be made of the same metal as the foil, or they can be made of aluminum or of plastic that is decomposed and driven off during the diffusion coating treatment. Acrylic plastics are particularly suitable for this purpose. Such twisted wires can be wound into the coil as spacers without the layer of diffusion coating pack, and the pack then vibrated into the spaces by standing the space-wound coil by its edge on a plate, covering its top with powdered diffusion coating pack, and subjecting the plate to vibration to cause the powder to work its way into the spaces between turns.

Alternatively the spacing layer of diffusion coating pack can be applied without supplemental devices for keeping the layer from spilling out prematurely. To this end the layer can be applied as a wet but non-flowing paste mixture or gel extruded onto the foil. A small content, such as ½% of a thixotropic polymer such as polyacrylic acid or mannan gum, added as a stirred solution in a readily vaporized solvent such as methyl ethyl ketone, to a standard diffusion coating mixture, does a good job of producing an extrudable gelled mixture.

The rewound foil with its spaced turns can then be packed in additional powder pack in a diffusion coating retort and subjected to the diffusion coating treatment. The rewound mass can be kept from unwinding during handling, as by wrapping lengths of the twisted wire or plastic around it, and securing the ends of these lengths together.

After the diffusion coating is completed, the treated coil is removed from the retort and the pack particles can be removed from between the turns. Because the foil is generally very brittle at this stage of the treatment, care is needed to keep from damaging it. The coil can have its outer wrap removed, stood by its side edge on a screen, and subjected to vibration to vibrate the pack particles down from between the coil turns and through the screen. Without uncoiling, the coil is then lowered into a leaching bath, such as 10 to 20% aqueous NaOH, to dissolve out the diffused-in metal.

When the leaching is completed the foil is no longer objectionably brittle, and it can be manipulated even though as much as ⅓ of the diffused-in metal has not been leached out. However it must be protected against exposure to air or oxygen, until ready for use. The coiled foil can for example be kept wet with a layer of nonane or triethanolamine or methylethylketone or acetone or glycerine and then slit and chopped to reduce it to individual rectangular foils of a convenient size such as ½ by 1 inch. A quantity of such individual foils or similarly prepared discs can then be packed in a container for pyrophoric use elsewhere, as discussed above in connection with the flares.

The nonane prevents premature pyrophoric action, but when a very thin layer is exposed to air it will evaporate away after about ¼ minute so that such action will then commence.

Foils that are aluminized on both faces tend to be less brittle than foils having twice as much aluminizing on one face. Thus an iron or nickel foil originally one mil thick can be aluminized to yield 0.7 mil thick aluminized cases on each surface with about 0.6 mil unaluminized case, and will withstand flexing much better than a corresponding foil aluminized on only one face to form a case 7/10 the final thickness.

Instead of slitting the final coil completely apart, the coil can be run through a perforating machine that cuts interrupted slits through it, longitudinally as well as transversely, leaving only a few unperforated points holding the individual small foils together. The thus-perforated material can then be rewound into a tight coil and packed in a container. Such a container can be fitted with an explosive charge as noted above, so that the coil can be expelled when desired, and the charge can be sufficiently strong to tear the coil into its individual perforated pieces.

The perforating treatment can be applied before the diffusion coating, instead of after. Regardless of the manner of preparation, the leached foil can be coated with picric acid, sodium picrate, triethanolamine or other material that increases its pyrophoric action.

The foil need not be a pure metal, but can be an alloy such as an alloy containing up to 4% chromium or up to 40% copper, and/or can have a laminated construction. An iron foil can for example be plated with a very thin layer, about 0.1 to 0.5 mil thick, of nickel on one or both surfaces. On the other hand, a suitable foil can be made of low alloy steels or alloys of iron and nickel containing 1% to 99% of either metal. A little carbon dispersed in or alloyed with the metal, as little as 0.1 to 1% or as much as 5% is helpful, as is a small content of other ingredients such as magnesium that are easily ignited.

The pyrophoric metal web can be in the form of a screen. Thus, a 100 mesh screen of 10 mil thick nickel wire can have 38 milligrams of aluminum diffused into it per square centimeter of wire surface, which after 1 to 1½ hours leaching with boiling 20% NaOH in water, becomes highly pyrophoric and merely left to dry will undergo a violet explosion.

A readily ignited metal such as titanium or magnesium in foil or wire form can also be given a nickel coating, as by rolling, and the nickel coating then rendered pyrophoric. To ignite the ignitable metal the coating should be at least about 0.4 mil thick.

The pyrophoric metals, regardless of how they are produced, can be plated as by electrolytic coatings from alkaline cyanide baths of zinc, cadmium, silver, tin or copper, without significantly diminishing their pyrophoricity. Such coatings that are over about 0.2 mil thick will significantly reduce the pyrophoric action.

Platinum activated by the aluminum diffusion and leaching, still contains a significant amount of the aluminum. Even when heated to high temperatures, such as 1800° to 2300° F. for days or weeks, that residual aluminum remains in the outermost 0.3 mil or so of the metal. This platinum wire so treated shows greater useful life at very high temperatures, e.g. 1800° F. or higher. The increased life appears to be a characteristic of platinum that is alloyed with from about 0 to about 5% aluminum and has been heated to from 1800° to 2300° F. for at least a week. This improvement is most significant for very fragile wires such as those not over about 10 mils thick. Thus wires less than 4 mils thick when used as catalytic screens in gaseous reactions, are subjected to vibratory flexure by the flow of reacting gases, as well as attack by naturally occurring catalyst poisons swept along by those gases. The aluminum-containing platinum stands up much better in such service than aluminum-free platinum.

Platinum freshly activated by aluminum diffusion and leaching, has a characteristic fissured surface illustrated in U.S. Pat. No. 4,154,705 and it would not be expected that longer mechanical life could be obtained with such a surface. However after days of service at extremely high temperatures, the fissures become less pronounced, but the wire remains rough.

The presence of up to about 15% of other platinum metals alloyed with the platinum and the aluminum, does not significantly reduce the life-lengthening effect of the aluminum. Thus a platinum-rhodium alloy screen made of 3 mil thick wire containing 10% rhodium, that is further alloyed with 2% aluminum, also shows a markedly long service life at 1800° F. and higher. Similar results are obtained when iridium is substituted for some or all of the rhodium.

Instead of introducing the aluminum into the platinum by diffusion, it can more inexpensively be introduced by melt alloying, for example at the same time rhodium is alloyed with the platinum. Wire drawn from the resulting alloy does not have the very high catalytic activity of platinum activated by surface diffusion and leaching as described above, but it is still strongly catalytic and it also has the long service life.

When the aluminum is introduced into a platinum screen by low-temperature diffusion, that is diffusion below about 900° F., the aluminum introduction is generally very slight or completely absent at locations such as wire crossover points where one wire touches another and at least partially blocks the diffusing action. Although little or no aluminum is located at those points, the resulting screen performs even better than one which has been subjected to heavy aluminizing that reaches 100% of its surface. A similar improvement can be obtained on heavily aluminized screens by following the caustic leach with an acid treatment, HCl for example, that leaches out extra amounts of aluminum.

The improved service life can be obtained when the aluminum-carrying platinum is subjected to the preliminary heat treatment in air, in a vacuum, in nitrogen, hydrogen or in catalytically reacting gases. It appears that 1800° to 2300° F. temperature for the minimum of one week is the key to long life.

Pyrophorically activated nickel and iron also retain some of the aluminum or zinc or the like used to activate them, even though these activating metals are leached out with strong hot aqueous caustic for 12 hours or more. When such leached pyrophoric products are dipped in 1 to 5% aqueous $H_2O_2$ for about ¼ to about 1 hour, their pyrophoricity is sharply reduced or entirely eliminated. Notwithstanding such reduction the products are still strongly catalytic. A nickel screen having forty 10 mil wires per inch, and diffusion aluminized at 950° F. for 16 hours followed by 12 hours of leaching in 20% aqueous NaOH at 180° F. with a final 30 minute dip in 2% aqueous $H_2O_2$, shows a very low overvoltage as a cathode in electrolyzing water containing a little dissolved KOH. Although the freshly leached screen is not pyrophoric, after two to four weeks electrolyzing the water, it tends to become pyrophoric. At this point a three-hour dip in 160° F. tap water will eliminate the pyrophoricity.

Although the screen pyrophoricity tends to increase while it is used as an electrolysis electrode, its catalytic effectiveness tends to very gradually drop during such use. After several years of such use, the screens are desirably re-activated by subjecting them to another aluminizing treatment followed by another leaching out of aluminum. The activated surface can be removed beforehand by prolonged exposure to dilute aqueous mineral acid.

In some cases the leached activated or re-activated screens retain a little pyrophoricity after the $H_2O_2$ treatment, even though that treatment is with 5% $H_2O_2$ for six hours. This retention is more pronounced the lower the aluminizing temperature, so long as the aluminum pick-up effected by the aluminizing is at least about 8, preferably over 20, milligrams per square centimeter of the screen's wire surface. The foregoing dip of the $H_2O_2$-treated screen in hot water for at least about 30 minutes or the $H_2O_2$ treatment after such dip, effectively eliminates the residual tendency to pyrophoricity, even when the aluminizing temperature is as low as 750° F.

The water for the final dip can be slightly acidulated, in which case the dip temperature can be reduced and still effect the desired pyrophoricity elimination. At a pH as low as 5, the lowest dip temperature should be about 145° F. A little acetic acid added to the water reduces its pH to about 3.5 or a little lower, and reduces the minimum dip temperature to about 40° F. The same temperature reduction is provided with stronger acids such as sulfuric and hydrochloric acids, although they bring the pH down to about 1 or less.

The higher the dip temperature, the shorter the dip time needed. Dips as long as 12 hours are extremely effective but when the water used in the dip is at or above about 170° F., adequate results are obtained by a dip of about 1 hour. There is a substantial amount of gassing as well as aluminum extraction during the dip, particularly when the dip water is close to its boiling point, and care should be taken to permit the elimination and release of gas from the dip water.

Highly prolonged dips appear to effect removal of all residual diffused-in aluminum, leaving a nickel product that is particularly desirable for a water-electrolyzing cathode.

Although the water dip is highly effective for eliminating pyrophoricity of activated nickel or iron that has been or is to be treated with $H_2O_2$, it does not eliminate or even significantly reduce the pyrophoricity of these activated metals without the $H_2O_2$ treatment. Applying the $H_2O_2$ treatment after the water dip is just as effective for pyrophoricity elimination as applying the $H_2O_2$ treatment followed by the water dip.

Activated nickel made by diffusion zincizing followed by leaching with an acid such as sulfuric or hydrochloric acid tends to have little or no pyrophoricity, although it is catalytic and has a very low overvoltage when used as cathode or anode in the electrolysis of water. Nickel activated this way need only be given the above $H_2O_2$ treatment to assure the complete absence of pyrophoricity.

Raney nickel and iron powder also can have their pyrophoricity eliminated by the foregoing combination of $H_2O_2$ treatment and water dip.

The electrolyzing of water with the catalytic nickel electrodes of the present invention is a highly desirable and very effective operation. It yields inexpensive gaseous hydrogen in large quantities, and the hydrogen is advantageously reacted with carbon monoxide to form methane and/or methanol. Along with hydrogen, gaseous oxygen is also produced by the electrolyzing of the water. Moreover such catalytic nickel has an extremely long life in such use.

Obviously many modifications and variations of the present invention are possible in the light of the above teachings. It is, therefore, to be understood that within the scope of the appended claims the invention may be practiced otherwise than as specifically described.

What is claimed:

1. In the treatment of pyrophorically activated catalytic Raney type nickel with hydrogen peroxide to eliminate its pyrophoricity and still leave it catalytically active, the improvement according to which the nickel is separately contacted with essentially water at a temperature at least as high as 160° F. to cause the extraction of residual activating metal and the elimination of the tendency of the nickel to recover its pyrophoricity.

2. The process of catalytically utilizing a nickel catalyst that had been an activated Raney type metal treated with $H_2O_2$ to eliminate its pyrophoricity but which in use again becomes pyrophoric, which process is characterized by subjecting the catalyst to the action essentially of water at a temperature at least as high as 160° F. to cause the water to extract additional activating metal and thus eliminate the newly developed pyrophoricity.

3. The process of claim 2 in which the pH of the water is about 5 and the water temperature is at least about 145° F.

4. The process of claim 2 in which the water has a pH of at least as low as about 3.5.

5. The nickel treatment combination of claim 1 in which the activating metal is aluminum.

6. In the treatment of pyrophorically activated catalytic Raney type nickel with hydrogen peroxide to eliminate its pyrophoricity and still leave it catalytically active, the improvement according to which the nickel is separately contacted with acidulated water having a pH at least as low as 5 and having a temperature high enough to cause it to extract residual activating metal from the nickel and eliminate the tendency of the nickel to recover its pyrophoricity.

7. The nickel treatment combination of claim 6, in which the pH of the acidulated water is at least as low as about 3.5 and the temperature of the acidulated water is at least as high as 40° F.

8. The nickel treatment combination of claim 6, in which the pH of the acidulated water is about 5 and the temperature of the acidulated water is at least as high as 145° F.

9. The process of catalytically utilizing a nickel catalyst that had been an activated Raney type metal treated with $H_2O_2$ to eliminate its pyrophoricity but which in use again becomes pyrophoric, which process is characterized by subjecting the catalyst to the action of acidulated water having a pH at least as low as 5 and having a temperature high enough to cause it to extract residual activating metal from the nickel and eliminate the tendency of the nickel to recover its pyrophoricity.

* * * * *